(12) United States Patent
Lee et al.

(10) Patent No.: US 10,332,579 B2
(45) Date of Patent: Jun. 25, 2019

(54) DRAM AND METHOD FOR OPERATING THE SAME

(71) Applicant: NANYA TECHNOLOGY CORPORATION, New Taipei (TW)

(72) Inventors: Chung-Hsun Lee, New Taipei (TW); Hsien-Wen Liu, Taoyuan County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/900,421

(22) Filed: Feb. 20, 2018

(65) Prior Publication Data

US 2019/0164589 A1    May 30, 2019

Related U.S. Application Data

(60) Provisional application No. 62/592,536, filed on Nov. 30, 2017.

(51) Int. Cl.
*G11C 11/406* (2006.01)

(52) U.S. Cl.
CPC .................. *G11C 11/406* (2013.01)

(58) Field of Classification Search
CPC ................................................ G11C 11/406
See application file for complete search history.

(56) References Cited

U.S. PATENT DOCUMENTS

| | | | |
|---|---|---|---|
| 5,511,020 A * | 4/1996 | Hu | G11C 16/10 |
| | | | 257/E27.103 |
| 5,652,723 A | 7/1997 | Dosaka et al. | |
| 6,438,057 B1 | 8/2002 | Ruckerbauer | |
| 2003/0169635 A1 | 9/2003 | Kim | |
| 2009/0262589 A1 | 10/2009 | Kong | |
| 2012/0300568 A1 | 11/2012 | Park et al. | |
| 2014/0016421 A1 * | 1/2014 | Kim | G11C 7/00 |
| | | | 365/222 |
| 2016/0211008 A1 * | 7/2016 | Benedict | G11C 7/02 |
| 2017/0140807 A1 * | 5/2017 | Sun | G11C 29/023 |

FOREIGN PATENT DOCUMENTS

| | | |
|---|---|---|
| KR | 20120115131 A | 10/2012 |
| TW | 201506950 A | 10/2012 |

OTHER PUBLICATIONS

Taiwanese Intellectual Property Office, Notice of Allowance, dated Dec. 28, 2018, 4 pages.

* cited by examiner

*Primary Examiner* — Anthan Tran
(74) *Attorney, Agent, or Firm* — Muncy, Geissler, Olds & Lowe, P.C.

(57) ABSTRACT

The present disclosure provides a dynamic random access memory (DRAM) including a memory array and a control device. The memory array includes a refresh unit. The refresh unit includes a first cell and a second cell. The first cell is configured to store data. The second cell is configured to have a stored electrical energy by being programmed with the first cell, wherein the first cell and the second cell are controllable by a same row of the memory array. The control device is configured to increase a refresh rate of the refresh unit to a first refresh rate when the stored electrical energy of the second cell becomes lower than a threshold electrical energy, wherein the threshold electrical energy is higher than a standard electrical energy for determining binary logic.

20 Claims, 12 Drawing Sheets

DRAM AND METHOD FOR OPERATING THE SAME

PRIORITY CLAIM AND CROSS-REFERENCE

This application claims the benefit of provisional application Ser. 62/592,536 filed on Nov. 30, 2017 and entitled "DRAM AND METHOD FOR OPERATING THE SAME," the disclosure of which is hereby incorporated by reference in its entirety.

TECHNICAL FIELD

The present disclosure relates to a dynamic random access memory (DRAM) and a method for operating the same, and more particularly, to a DRAM and a method for operating the same with relatively efficient power consumption.

DISCUSSION OF THE BACKGROUND

Dynamic random access memory (DRAM) is a type of random access memory that stores each bit of data in a separate capacitor. A simplest DRAM cell comprises a single N-type metal-oxide-semiconductor (NMOS) transistor and a single capacitor. If charge is stored in the capacitor, the cell is said to store a logic HIGH, depending on the convention used. If no charge is present, the cell is said to store a logic LOW. Because the charge in the capacitor dissipates over time, DRAM systems require additional refreshing circuitries to periodically refresh the charge stored in the capacitors. Since a capacitor can store only a very limited amount of charge, in order to quickly distinguish the difference between a logic 1 and a logic 0, two bit lines (BLs) are typically used for each bit, wherein the first in the bit line pair is known as a bit line true (BLT) and the other is the bit line complement (BLC). The single NMOS transistor's gate is controlled by a word line (WL).

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a DRAM including a memory array and a control device. The memory array includes a refresh unit. The refresh unit includes a first cell and a second cell. The first cell is configured to store data. The second cell is configured to have a stored electrical energy by being programmed with the first cell, wherein the first cell and the second cell are controllable by a same row of the memory array. The control device is configured to increase a refresh rate of the refresh unit to a first refresh rate when the stored electrical energy of the second cell becomes lower than a threshold electrical energy, wherein the threshold electrical energy is higher than a standard electrical energy for determining binary logic.

In some embodiments, the control device is configured to no longer decrease the refresh rate after the refresh rate is increased.

In some embodiments, a quantity of cells, whose stored electrical energy becomes lower than the threshold electrical energy, of the refresh unit has positive correlation with the refresh rate.

In some embodiments, the stored electrical energy is decreased by a decreased level, wherein the decreased level has positive correlation with the refresh rate.

In some embodiments, the DRAM further includes an observation device configured to monitor a decrease, due to a degradation of the second cell, in the stored electrical energy of the second cell.

In some embodiments, the control device is configured to increase the refresh rate to the first refresh rate when a voltage level of the second cell becomes lower than a threshold voltage level, wherein the threshold voltage level is higher than a standard voltage level for determining binary logic.

In some embodiments, the threshold voltage level is a first threshold voltage level, wherein the control device is configured to increase the refresh rate from the first refresh rate to a second refresh rate when the voltage level becomes lower than both the first threshold voltage level and a second threshold voltage level, wherein the second threshold voltage is lower than the first threshold voltage level and higher than the standard voltage level.

In some embodiments, the control device is configured to increase the refresh rate to the first refresh rate when a magnitude of a leakage current from the second cell becomes higher than a threshold magnitude.

In some embodiments, the threshold magnitude is a first threshold magnitude, wherein the control device is configured to increase the refresh rate from the first refresh rate to a second refresh rate when the magnitude becomes higher than both the first threshold magnitude and a second threshold magnitude higher than the first threshold magnitude.

In some embodiments, the refresh unit further includes a third cell. The control device is configured to increase the refresh rate to the first refresh rate when the stored electrical energy becomes lower than the threshold electrical energy and when a stored electrical energy of the third cell remains higher than the threshold electrical energy.

In some embodiments, the control device is configured to increase the refresh rate from the first refresh rate to the second refresh rate when both the stored electrical energy of the second cell and the stored electrical energy of the third cell become lower than the threshold electrical energy.

In some embodiments, the control device is configured to increase the refresh rate to the first refresh rate when a voltage level of the second cell becomes lower than a threshold voltage level and when a voltage level of the third cell remains higher than the threshold voltage level, wherein the threshold voltage level is higher than a standard voltage level for determining binary logic.

In some embodiments, the control device is configured to increase the refresh rate from the first refresh rate to the second refresh rate when both the voltage level of the second cell and the voltage level of the third cell become lower than the threshold voltage level.

In some embodiments, the control device is configured to increase the refresh rate to the first refresh rate when a magnitude of a leakage current from the second cell becomes higher than a threshold magnitude and when a magnitude of a leakage current from the third cell remains lower than the threshold magnitude.

In some embodiments, the control device is configured to increase the refresh rate from the first refresh rate to the second refresh rate when the magnitude of each of the leakage currents from the second cell and the third cell become higher than the threshold magnitude.

Another aspect of the present disclosure provides a method. The method includes providing a first cell, controllable by a row, for storing data; providing a second cell, controllable by the row, with a stored electrical energy by programming the second cell with the first cell; and increasing a refresh rate of a refresh unit that includes the row to a first refresh rate when the stored electrical energy of the second cell becomes lower than a threshold electrical energy, wherein the threshold electrical energy is higher than a standard electrical energy for determining binary logic.

In some embodiments, the method further includes monitoring a decrease, due to degradation of the second cell, in the stored electrical energy.

In some embodiments, the method further includes no longer decreasing the refresh rate after the refresh rate is increased.

In some embodiments, the providing the second cell, controllable by the row, with the stored electrical energy by programming the second cell with the first cell includes providing the second cell with a voltage level. The increasing the refresh rate of the refresh unit that includes the row to the first refresh rate when the stored electrical energy of the second cell becomes lower than the threshold electrical energy includes increasing the refresh rate to the first refresh rate when the level of the second cell becomes lower than a threshold voltage level, wherein the threshold voltage level is higher than a standard voltage level for determining binary logic.

In some embodiments, the increasing the refresh rate of the refresh unit that includes the row to the first refresh rate when the stored electrical energy of the second cell becomes lower than the threshold electrical energy includes increasing the refresh rate to the first refresh rate when a magnitude of a leakage current from the second cell becomes higher than a threshold magnitude.

In the present disclosure, a refresh unit that includes the degraded first cell, which stores a user data, can be identified by the second cell. As such, a refresh rate of a refresh unit can be increased to prevent the user data from being lost. Moreover, since such refresh unit can be identified, there is no need to increase a refresh rate of all refresh units of the memory array. As a result, power consumption is relatively efficient. Moreover, in the present disclosure, once the refresh rate is increased, the refresh rate is no longer decreased in any circumstance. As a result, a data stored in the degraded first cell is more reliable.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1:
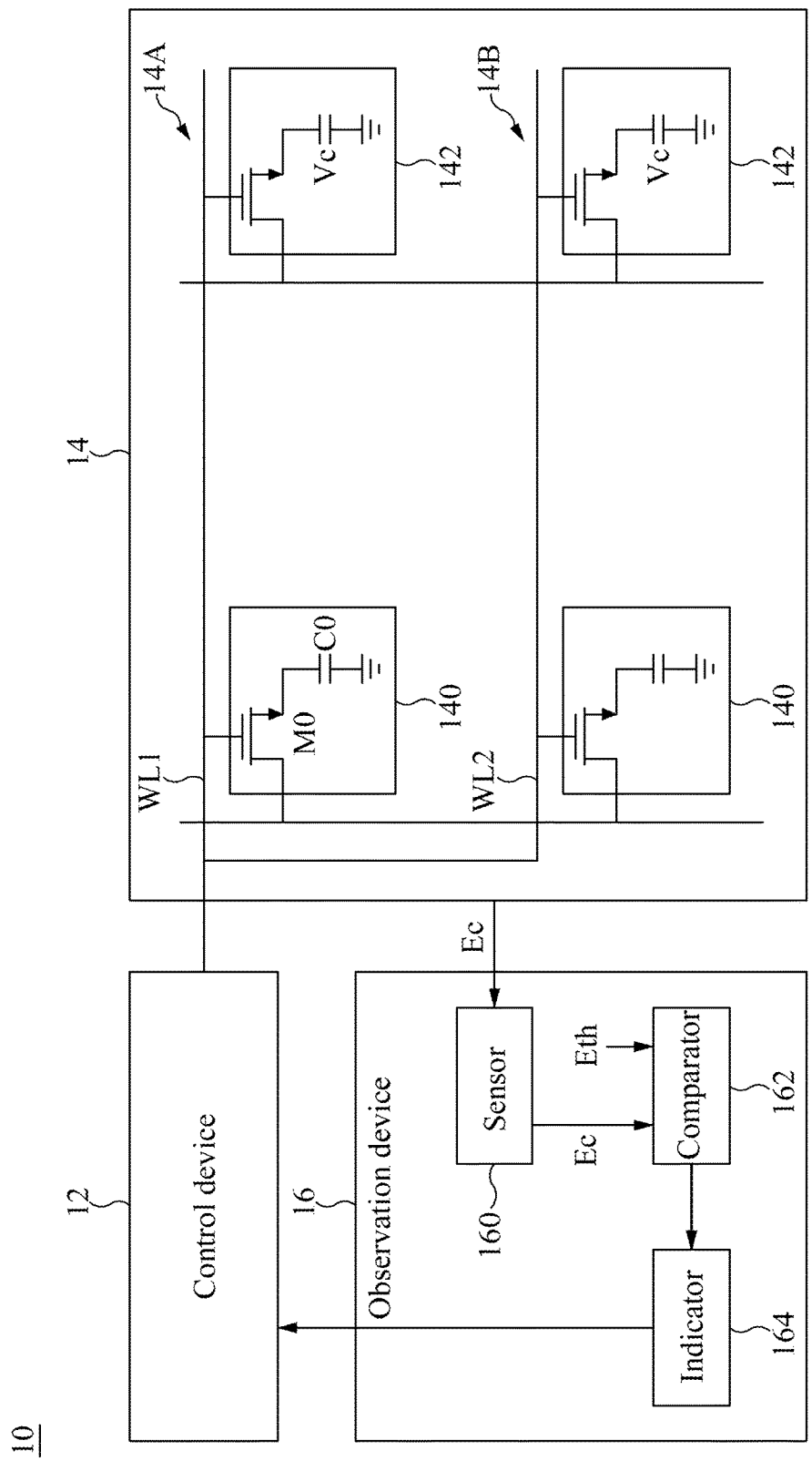
FIG. 1 is a block diagram of a dynamic random access memory (DRAM), in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a block diagram of a dynamic random access memory (DRAM) 10, in accordance with some embodiments of the present disclosure. Referring to FIG. 1, the DRAM 10 includes a control device 12, a memory array 14, and an observation device 16.

The control device 12 functions to control an access operation, for example, a read operation, or a write operation, on the memory array 14. Moreover, the control device 12 functions to adjust a refresh rate of the memory array 14, which will be described in detail below. In an embodiment, the control device 12 includes a central processing unit (CPU) or part of a computing module.

The memory array 14 includes a first refresh unit 14A and a second refresh unit 14B. The first refresh unit 14A functions to store data. The second refresh unit 14B also functions to store data.

The first refresh unit 14A includes a row WL1, a first cell 140 and a second cell 142. The first cell 140 and the second cell 142 are controllable by the same row WL1, which means that the first cell 140 and the second cell 142 are programmed together.

The first cell 140 functions to store data. In further detail, the first cell 140 includes a transistor MO and a capacitor CO. Data is stored in the capacitor CO through the transistor MO by programming the first cell 140. Data stored in the first cell 140 is a data associated with, for example, a program that a user executes. As such, the data stored in the first cell can also be called a user data; and the first cell 140 can also be called a user cell.

The second cell 142 is provided with an electrical energy Ec (or called a stored electrical energy Ec) associated with a voltage level Vc by being programmed with the first cell 140. Moreover, the second cell 142 functions to test a degradation of the first cell 140. In further detail, because the second cell 142 has the same semiconductor structure as the first cell 140 and since the second cell 142 is controllable by the same row WL1 as the first cell 140 and therefore is programmed in the same manner as the first cell 140, the second cell 142 has the same degradation as the first cell 140. When the second cell 142 is degraded, the first cell 140 is degraded. Further, a level of a degradation of the second cell 142 is the same as that of the first cell 140. As a result, a level of a degradation of the first cell 140 can be determined by testing a level of a degradation of the second cell 142. Since the second cell 142 is used to store a dummy data instead of a data associated with a program that a user executes, the second cell 142 can be called a redundant cell.

For clarity of discussion, only one first cell 140 serving as a data cell is depicted. However, the present disclosure is not limited thereto. In some embodiments, the first refresh unit 14A may include a plurality of first cells 140.

The second refresh unit 14B is similar in operation and in components to the first refresh unit 14A except that, for example, the second refresh unit 14B includes a word line WL2. Therefore, operation of the second refresh unit 14B is omitted herein.

The observation device 16 functions to determine whether the second cell 142 is degraded based on a decrease in the electrical energy Ec of the second cell 142, and observe which refresh unit includes the second cell 142 determined to be degraded, and to inform the control device 12 of the observation result. The control device 12, based on the observation result, increases a refresh rate of a refresh unit that includes the second cell 142 determined to be degraded. In further detail, when the observation result indicates that the second cell 142 in the first refresh unit 14A is determined to be degraded, the control device 12 increases a refresh rate of the first refresh unit 14A. Alternatively, when the observation result indicates that the second cell 142 in the second refresh unit 14B is determined to be degraded, the control device 12 increases a refresh rate of the second refresh unit 14B. Alternatively, when the observation result indicates that the second cells 142 in both the first refresh unit 14A and the second refresh unit 14B are determined to be degraded, the control device 12 increases refresh rates of both the first refresh unit 14A and the second refresh unit 14B.

With the observation device 16 and the second cell 12, a refresh unit that includes the degraded first cell 14 for storing a user data can be identified. As such, a refresh rate of such refresh unit can be increased to prevent the user data from being lost. Moreover, since such refresh unit can be identified, there is no need to increase a refresh rate of all refresh units of the memory array 14. As a result, power consumption is relatively efficient.

The observation device 16 includes a sensor 160, a comparator 162 and an indicator 164.

The sensor 160 functions to sense the electrical energy Ec of each of the second cells 142 of the first refresh unit 14A and the second refresh unit 14B, and sends each sensing results indicating the electrical energy Ec to the comparator 162.

The comparator 162 functions to compare the electrical energy Ec with a threshold electrical energy Eth for both the first refresh unit 14A and the second refresh unit 14B. The threshold electrical energy Eth is higher than a standard electrical energy for determining binary logic.

The binary logic includes binary 1 and binary 0. When an electrical energy of a data is higher than the standard electrical energy, the data can be deemed as the binary 1 or the binary 0, depending on a designer's preferences. For clarity of discussion, in the following text, when an electrical energy of a data is higher than the standard electrical energy, the data is deemed as the binary 1. Similarly, when an electrical energy of a data is lower than the standard electrical energy, the data is deemed as the binary 0.

The reason why the threshold electrical energy Eth is set to be higher than a standard electrical energy is that the control device 12 can increase a refresh rate of a refresh unit that includes the degraded second cell 142 so as to maintain a data's correctness before the electrical energy Ec becomes lower than the standard electrical energy, which would cause the data to be incorrect.

The indicator 164 determines, based on the comparison result from the comparator 162, whether the second cell 142 is degraded, and, if the second cell 142 determined to be degraded exists, the indicator 164 determines which refresh unit includes the second cell 142 determined to be degraded. The control device 12, based on the determination from the indicator 164, increases a refresh rate of a refresh unit that includes the second cell 142 determined to be degraded, as previously mentioned.

Taking the first refresh unit 14A for instance, in operation, to observe whether the second cell 142 is degraded or not, the second cell 142 is initially provided with the electrical energy Ec associated with the voltage level Vc by being programmed with the first cell 140 of the first refresh unit 14A. The electrical energy Ec is higher than the threshold electrical energy Eth. After the DRAM 10 has been used for a long time, the second cell 142 becomes gradually degraded and therefore retention ability of the second cell 142 becomes poor. As a result, the electrical energy Ec of the second cell 142 is gradually decreased.

After the electrical energy Ec is decreased, if the electrical energy Ec remains higher than the threshold electrical energy Eth, the observation device 16 determines that the second cell 142 is not degraded. As a result, the control device 12 substantially maintains the first refresh unit's 14A refresh rate unchanged.

Alternatively, after the electrical energy Ec is decreased, if the electrical energy Ec becomes lower than the threshold electrical energy Eth, the observation device 16 determines that the second cell 142 is degraded. As a result, the control device 12 increases the refresh rate of the first refresh unit 14A to a first refresh rate.

In an embodiment, the control device 12 no longer decreases the refresh rate after the refresh rate is increased. In some existing DRAMs, an increased refresh rate may be decreased again in some circumstance, for example, in a power saving mode or in a case of a temperature decrease. However, in the present disclosure, once the refresh rate is increased, the refresh rate is no longer decreased in any circumstance. As a result, a data stored in the degraded first cell 140 is more reliable.

Operation of the second refresh unit 14B is the same as that of the first refresh unit 14A. Therefore, the detailed descriptions are omitted herein.

Figure 2:
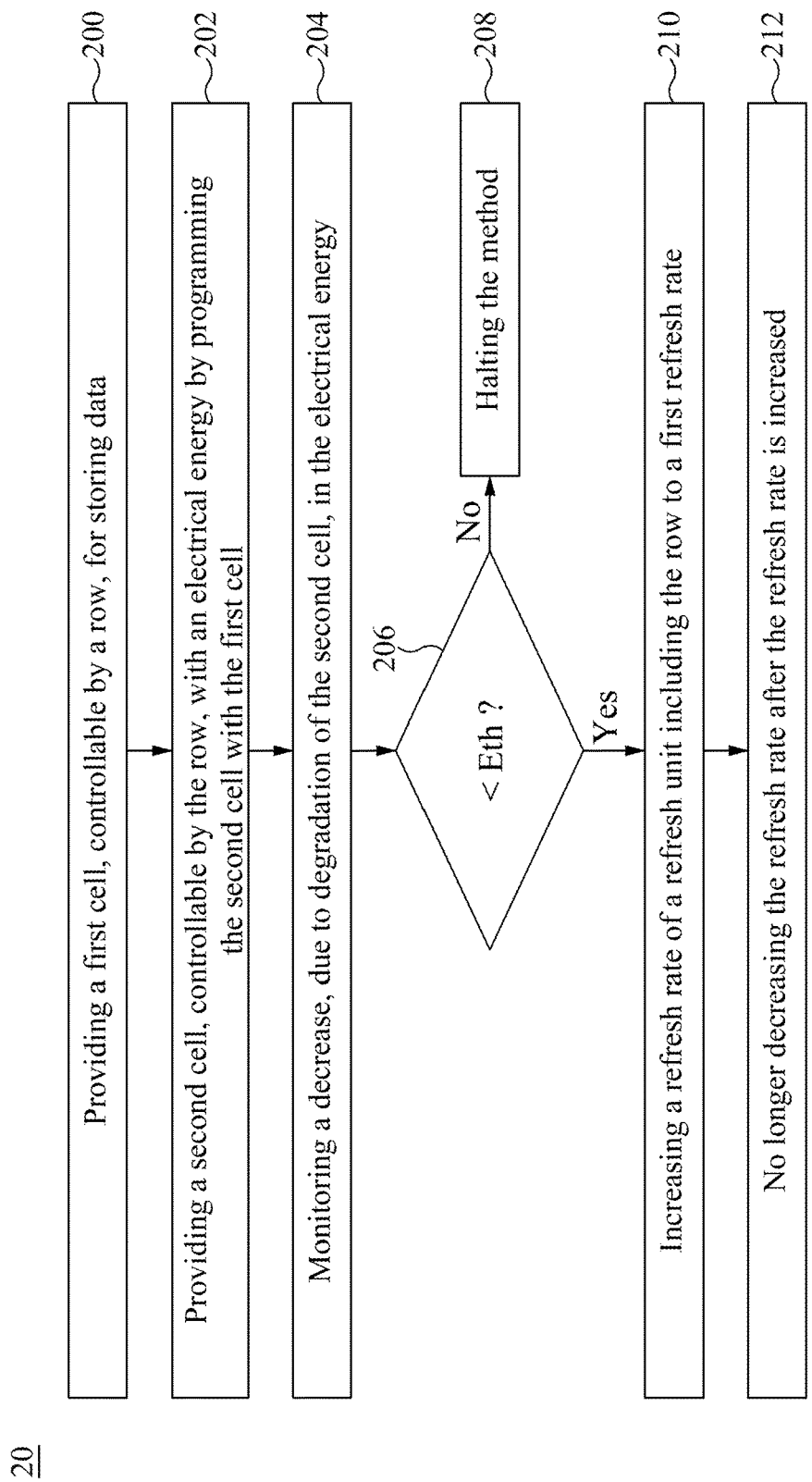
FIG. 2 is a flow diagram of a method of operating a DRAM, in accordance with some embodiments of the present disclosure.

FIG. 2 is a flow diagram of a method 20 operating a DRAM, in accordance with some embodiments of the present disclosure. Referring to FIG. 2, the method 20 includes operations 200, 202, 204, 206, 208, 210 and 212.

The method 20 begins with operation 200, in which a first cell is provided. The first cell is controllable by a row, and is for storing data. The first cell stores a user data, and therefore can be called a user cell.

The method 20 continues with operation 202, in which a second cell is provided with an electrical energy by being programmed with the first cell. The second cell is controllable by the same row as the first cell. The second cell is not used to store a user data, and therefore is called a redundant cell.

The method 20 proceeds to operation 204, in which a decrease in the electrical energy due to degradation of the second cell is monitored. After the DRAM has been used for a long time, the second cell becomes gradually degraded and therefore retention ability of the second cell becomes poor. As a result, the electrical energy is gradually decreased.

The method 20 continues with operation 206, in which it is determined whether the electrical energy becomes lower than a threshold electrical energy Eth, wherein the threshold electrical energy Eth is higher than a standard electrical energy for determining binary logic. The binary logic includes binary 1 and binary 0. If negative, the method 20 proceeds to operation 208, in which the method 20 is halted. If affirmative, the method 20 proceeds to operation 210, in which a refresh rate of a refresh unit that includes the row is increased to a first refresh rate.

Subsequent to operation 210, in operation 212, the refresh rate is no longer decreased after the refresh rate is increased.

In the present disclosure, a refresh unit that includes the degraded first cell that stores a user data can be identified by the second cell. As such, a refresh rate of a refresh unit can be increased to prevent the user data from being lost. Moreover, since such refresh unit can be identified, there is no need to increase a refresh rate of all refresh units of the memory array. As a result, power consumption is relatively efficient. Moreover, in the present disclosure, once the refresh rate is increased, the refresh rate is no longer decreased in any circumstance. As a result, a data stored in the degraded first cell is more reliable.

Figure 3:
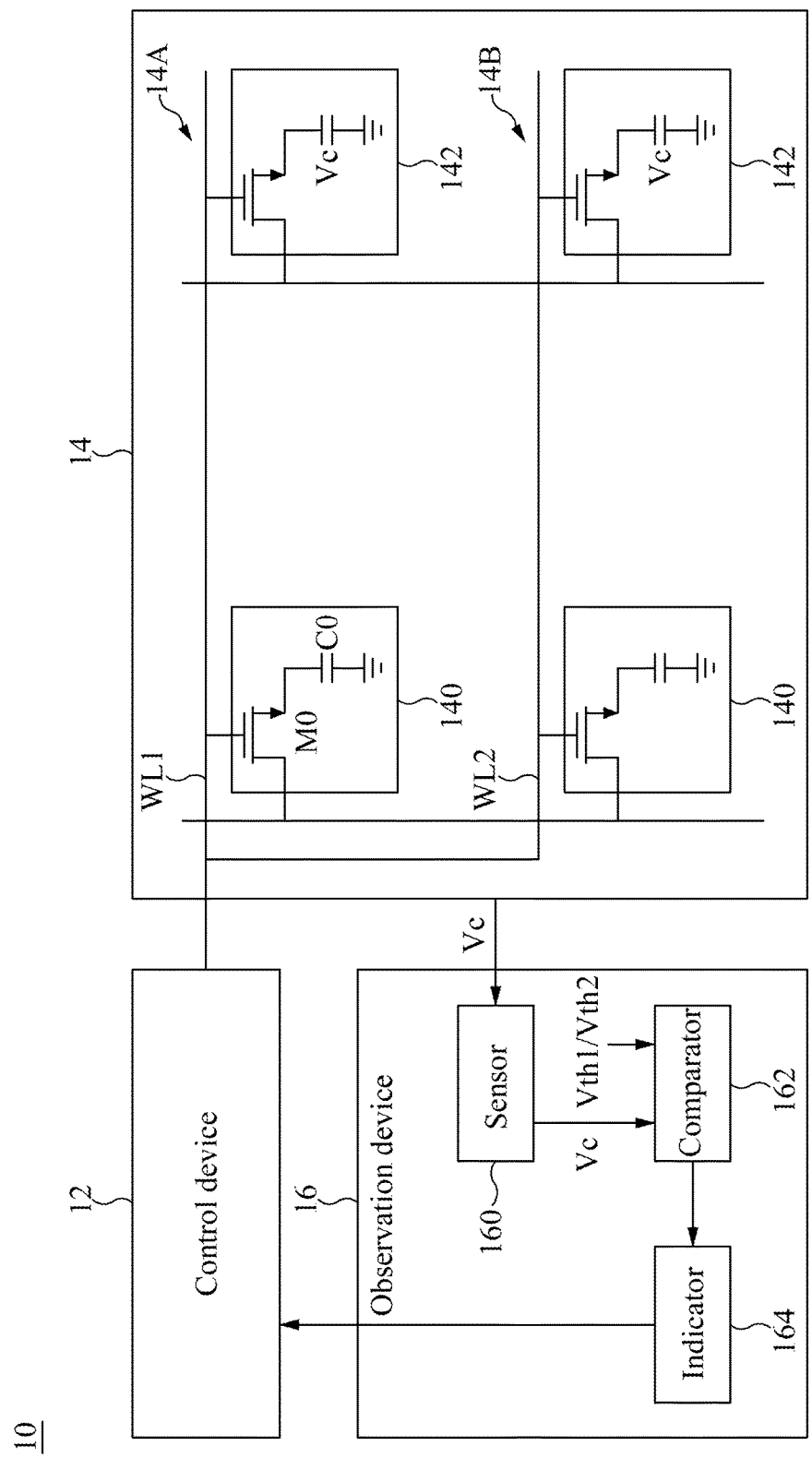
FIG. 3 is a block diagram illustrating an operation of the DRAM shown in FIG. 1, in accordance with some embodiments of the present disclosure.

FIG. 3 is a block diagram illustrating an operation of the DRAM 10 shown in FIG. 1, in accordance with some embodiments of the present disclosure. Referring to FIG. 3, the operation shown in FIG. 3 is similar to that shown in FIG. 1 except that, for example, in FIG. 3, a voltage level Vc is sensed.

As mentioned in the embodiment of FIG. 3, the second cell 142 is initially provided with the voltage level Vc by being programmed with the first cell 140. After the DRAM 10 has been used for a long time, the second cell 142 becomes gradually degraded and therefore the voltage level Vc is decreased. The sensor 160 senses the voltage level Vc, and sends a sensing result indicating the voltage level Vc to the comparator 162.

The comparator 162 compares the voltage level Vc with a first threshold voltage level Vth1, wherein the first threshold voltage level Vth1 is higher than a standard voltage level for determining binary logic. If the voltage level Vc becomes lower than the first threshold voltage level Vth1, the comparator 162 then compares the voltage level Vc with a second threshold voltage level Vth2, wherein the second threshold voltage level Vth2 is lower than the first threshold voltage level Vth1 and higher than the standard voltage level.

The indicator 164 determines, based on the comparison result from the comparator 162, whether the second cell 142 is degraded. If the second cell 142 determined to be degraded exists, the indicator 164 then determines which refresh unit includes the second cell 142 determined to be degraded. The indicator 164 also determines, based on the comparison result, a level of the degradation. When the voltage level Vc becomes lower than both the first threshold voltage level Vth1 and the second threshold voltage level Vth2, a level of a degradation is relative high.

The control device 12, based on the determinations from the indicator 164, increases a refresh rate of a refresh unit that includes the second cell 142 determined to be degraded, as previously described. Moreover, the control device 12, based on the determinations, increases the refresh rate to the first refresh rate, or to the second refresh rate.

In further detail, the control device 12 increases the refresh rate to the first refresh rate when the voltage level Vc of the second cell 142 becomes lower than the first threshold voltage level Vth1 and is higher than the second threshold voltage level Vth2. Alternatively, the control device 12 increases the refresh rate from the first refresh rate to the second refresh rate when the voltage level Vc becomes lower than both the first threshold voltage level Vth1 and the second threshold voltage level Vth2.

In summary, the voltage level Vc is decreased by a decreased level. The decreased level has positive correlation with the refresh rate. That is, when the decreased level is higher, the refresh rate is higher.

Operation of the second refresh unit 14B is the same as that of the first refresh unit 14A. Therefore, the detailed descriptions are omitted herein.

In the present disclosure, with the observation device 16 and the second cell 12, a refresh unit that includes the degraded first cell 14 for storing a user data can be identified. As such, a refresh rate of such refresh unit can be increased to prevent the user data from being lost. Moreover, since such refresh unit can be identified, there is no need to increase a refresh rate of all refresh units of the memory array 14. As a result, power consumption is relatively efficient. Moreover, since an increase level of a refresh rate can be adjusted based on a level of degradation of the second cell 142, application of the DRAM 10 is relatively flexible.

Figure 4:
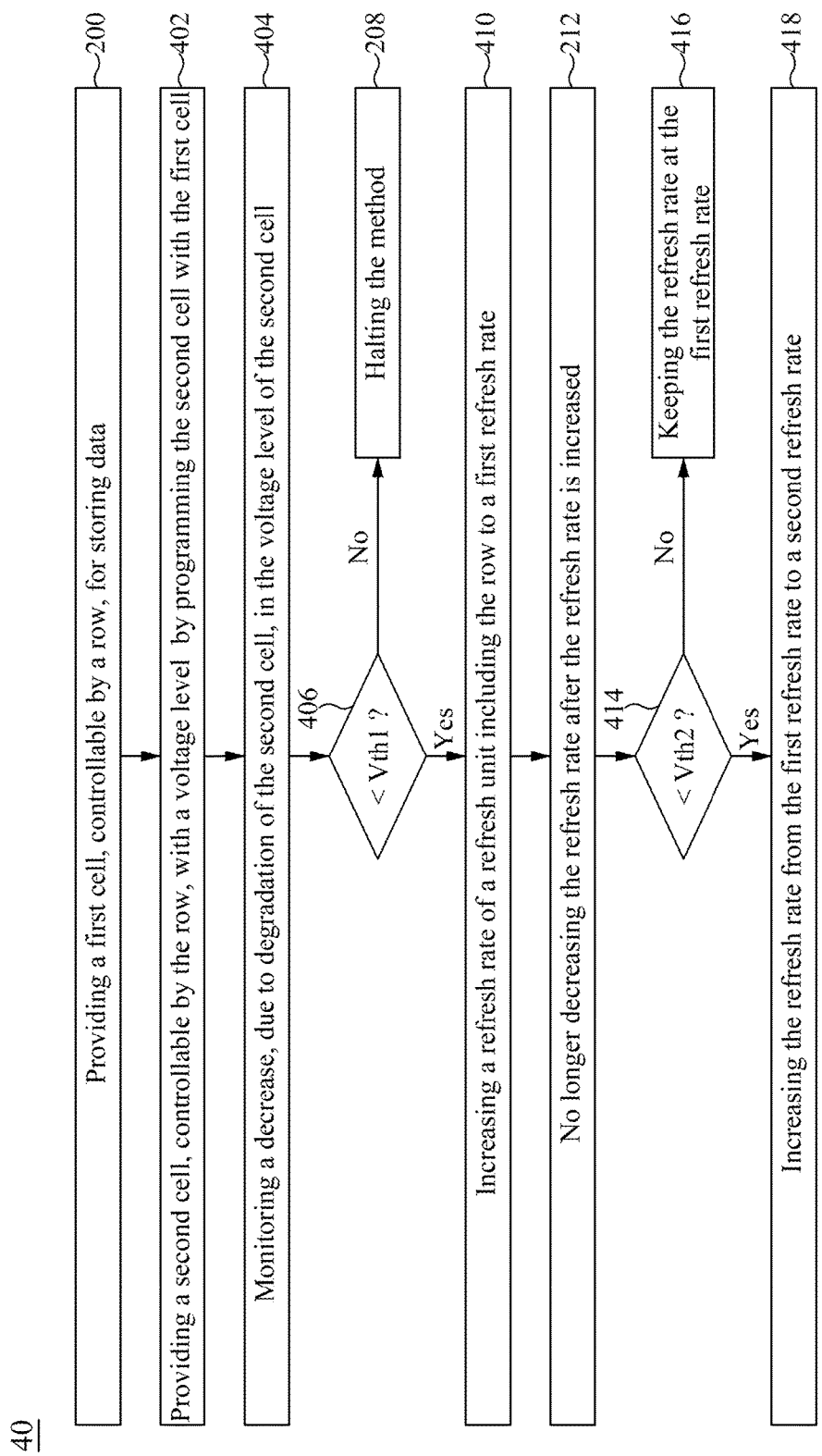
FIG. 4 is a flow diagram of another method of operating a DRAM, in accordance with some embodiments of the present disclosure.

FIG. 4 is a flow diagram of another method 40 of operating a DRAM, in accordance with some embodiments of the present disclosure. Referring to FIG. 4, the method 40 is similar to the method 20 described and illustrated with reference to FIG. 2 except that, for example, the method 40 includes operations 402, 404, 406, 410, 412, 414, 416 and 418.

In operation 402, a second cell, controllable by the row, is provided with a voltage level by being programmed with the first cell.

In operation 404, a decrease, due to degradation of the second cell, in the voltage level of the second cell is monitored.

In operation 406, it is determined whether the voltage level becomes lower than a first threshold voltage level Vth1, wherein the first threshold voltage level Vth1 is higher than a standard voltage level for determining binary logic. If negative, the method 40 proceeds to operation 208. If affirmative, the method 40 proceeds to operation 410, in which a refresh rate of a refresh unit that includes the row is increased to a first refresh rate.

In operation 414, it is determined whether the voltage level becomes lower than a second threshold voltage level Vth2, wherein the second threshold voltage level Vth2 is lower than the first threshold voltage Vth1. If negative, the method 40 proceeds to operation 416, in which the refresh rate is kept at the first refresh rate. If affirmative, the method 40 proceeds to operation 418, in which the refresh rate is increased from the first refresh rate to a second refresh rate.

Although in the flow diagram, the refresh rate is increased in two stages, increasing to the first refresh rate and then increasing from the first refresh rate to the second refresh rate, the present disclosure is not limited thereto. The refresh rate can be increased directly to the second refresh rate.

In the present disclosure, a refresh unit that includes the degraded first cell, which stores a user data, can be identified by the second cell. As such, a refresh rate of a refresh unit can be increased to prevent the user data from being lost. Moreover, since such refresh unit can be identified, there is no need to increase a refresh rate of all refresh units of the memory array. As a result, power consumption is relatively efficient. Moreover, since an increase level of a refresh rate can be adjusted based on a level of degradation of the second cell, application of the DRAM is relatively flexible.

Figure 5:
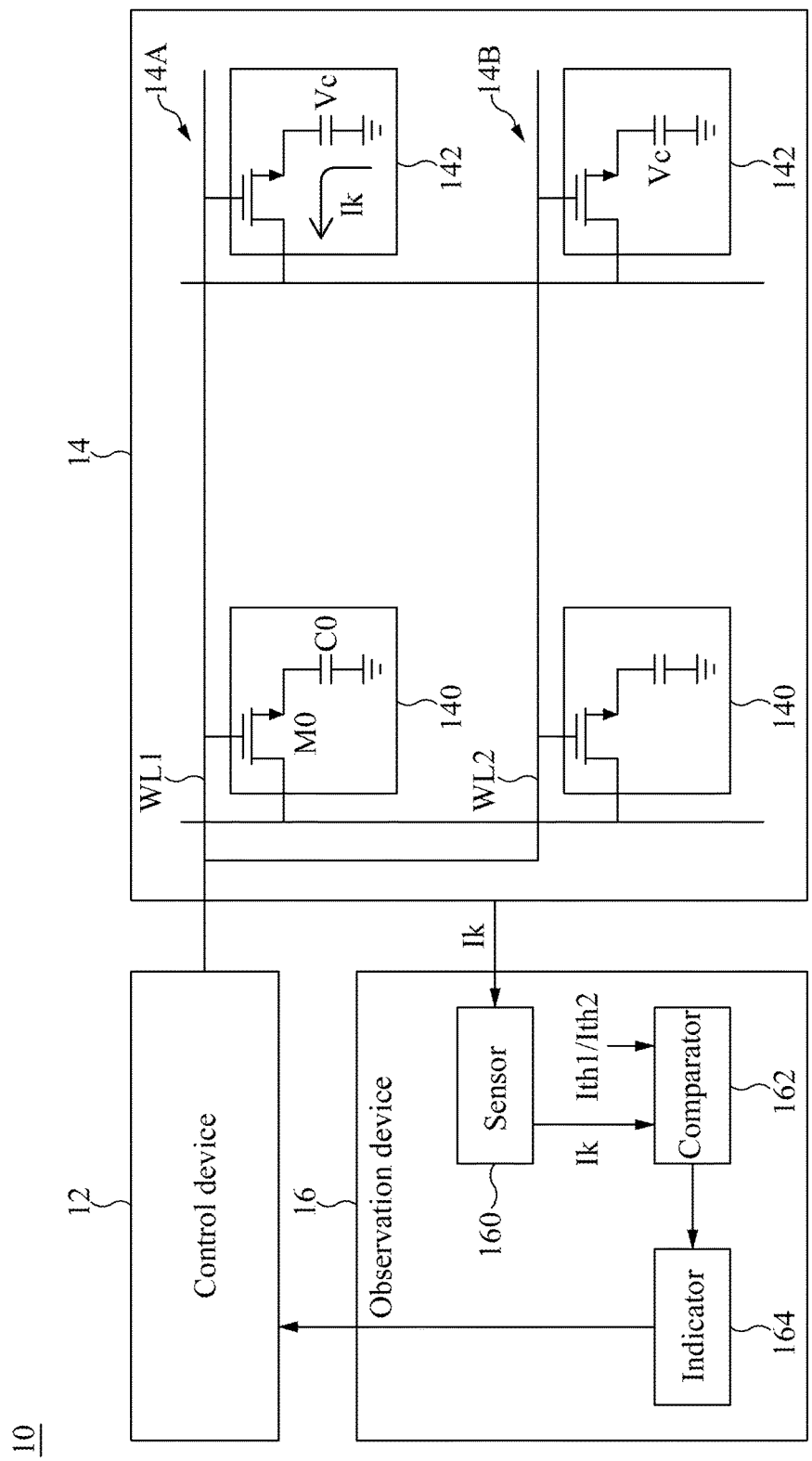
FIG. 5 is a block diagram illustrating another operation of the DRAM shown in FIG. 1, in accordance with some embodiments of the present disclosure.

FIG. 5 is a block diagram illustrating another operation of the DRAM 10 shown in FIG. 1, in accordance with some embodiments of the present disclosure. Referring to FIG. 5, the operation shown in FIG. 5 is similar to that shown in FIG. 1 except that, for example, in FIG. 5, a magnitude Ik of a leakage current from the second cell 142 is sensed.

As mentioned in the embodiment of FIG. 3, the second cell 142 is initially provided with a voltage level Vc by being programmed with the first cell 140. In an initial state, a magnitude of a leakage current from the second cell 142 is the magnitude Ik. After the DRAM 10 has been used for a long time, the second cell 142 becomes gradually degraded and therefore retention ability of the first cell 140 becomes poor. As a result, the magnitude Ik of a leakage current from the degraded second cell 142 gradually increases. Therefore, the voltage level Vc of the second cell 142 is gradually decreased.

The sensor 160 senses the magnitude Ik, and sends a sensing result indicating the magnitude Ik to the comparator 162.

The comparator 162 compares the magnitude Ik with a first threshold magnitude Ith1. If the magnitude Ik becomes higher than the first threshold magnitude Ith1, the comparator 162 compares the magnitude Ik with a second threshold magnitude Ith2 higher than the first threshold magnitude Ith1.

The indicator 164 determines, based on the comparison result from the comparator 162, whether the second cell 142 is degraded. If a second cell 142 determined to be degraded exists, the indicator 164 determines which refresh unit includes the second cell 142 determined to be degraded. Next, the indicator 164 determines, based on the comparison result, a level of the degradation. When the magnitude Iki becomes higher than both the first threshold magnitude Ith and the second threshold magnitude Ith2, a level of a degradation is relative high.

The control device 12, based on the determinations from the indicator 164, increases a refresh rate of a refresh unit that includes the second cell 142 determined to be degraded, as previously mentioned. Moreover, the control device 12, based on the determinations, increases the refresh rate to the first refresh rate, or to the second refresh rate.

In further detail, the control device 12 increases the refresh rate to the first refresh rate when the magnitude Ik becomes higher than the first threshold magnitude Ith1 and is lower than the second threshold magnitude Ith2. Alternatively, the control device 12 increases the refresh rate from the first refresh rate to the second refresh rate when the magnitude Ik becomes higher than both the first threshold magnitude Ith1 and the second threshold magnitude Ith2.

In summary, the magnitude Ik is increased by an increased level. The increased level has positive correlation with the refresh rate. That is, when the increased level is higher, the refresh rate is higher.

Operation of the second refresh unit 14B is the same as that of the first refresh unit 14A. Therefore, the detailed descriptions are omitted herein.

In the present disclosure, with the observation device 16 and the second cell 12, a refresh unit that includes the degraded first cell 14 for storing a user data can be identified. As such, a refresh rate of such refresh unit can be increased to prevent the user data from being lost. Moreover, since such refresh unit can be identified, there is no need to increase a refresh rate of all refresh units of the memory array 14. As a result, power consumption is relatively efficient. Moreover, since an increase level of a refresh rate can be adjusted based on a level of degradation of the second cell 142, application of the DRAM 10 is relatively flexible.

Figure 6:
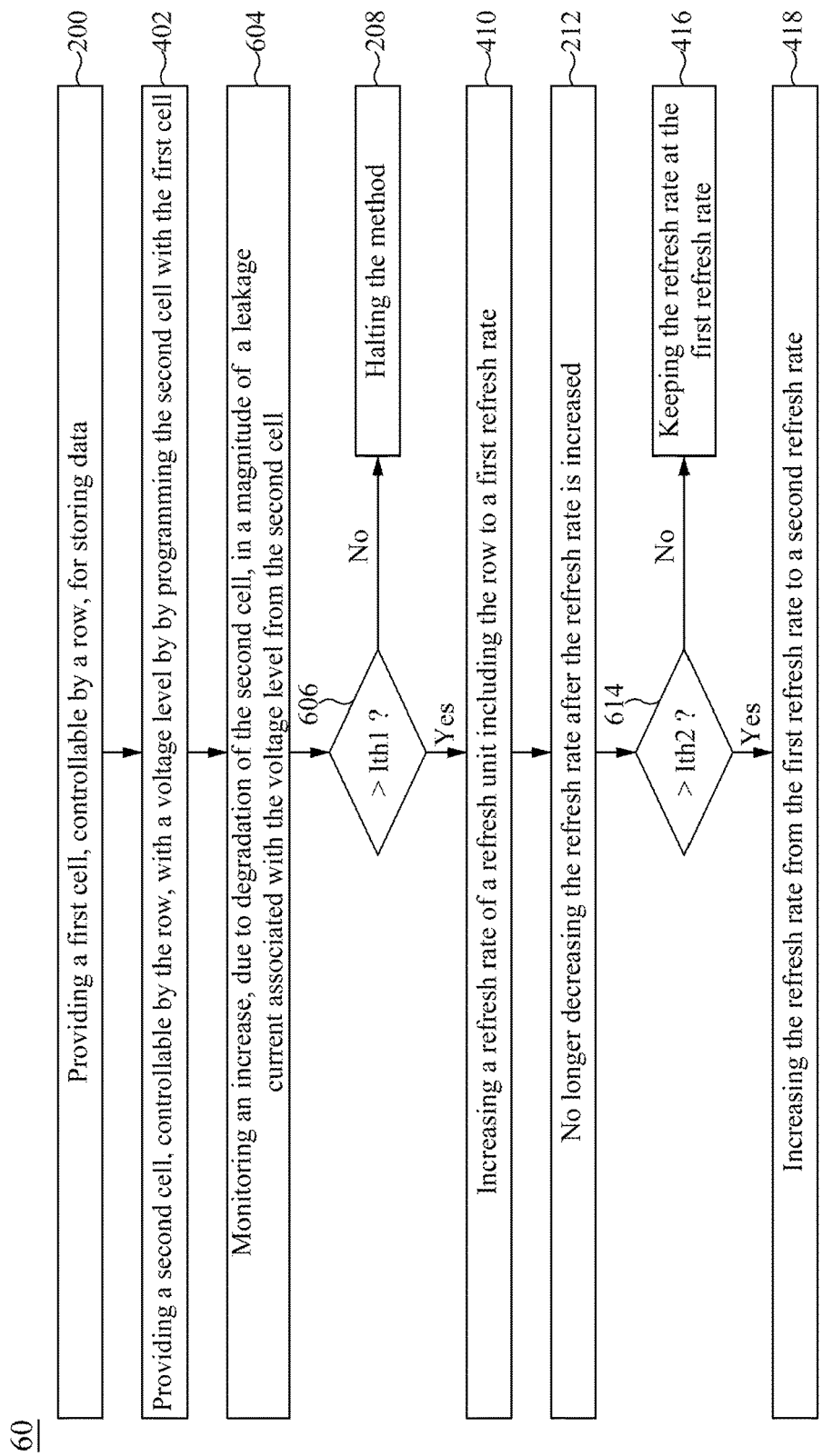
FIG. 6 is a flow diagram of yet another method of operating a DRAM, in accordance with some embodiments of the present disclosure.

FIG. 6 is a flow diagram of yet another method 60 of operating a DRAM, in accordance with some embodiments of the present disclosure. Referring to FIG. 6, the method 60 is similar to the method 40 described and illustrated with reference to FIG. 4 except that, for example, the method 60 includes operations 604, 606 and 614.

In operation 604, an increase, due to degradation of the second cell, in a magnitude of a leakage current associated with the voltage level from the second cell is monitored.

In operation 606, it is determined whether the magnitude becomes higher than a first threshold magnitude Ith1. If negative, the method 60 proceeds to operation 208. If affirmative, the method 60 proceeds to operation 410.

In operation 614, it is determined whether the magnitude becomes higher than a second threshold magnitude Ith2, which is higher than the first threshold magnitude Ith1. If negative, the method 60 proceeds to operation 416. If affirmative, the method 60 proceeds to operation 418.

Although in the flow diagram, the refresh rate is increased in two stages, increasing to the first refresh rate and then increasing from the first refresh rate to the second refresh rate, the present disclosure is not limited thereto. The refresh rate can be increased directly to the second refresh rate.

In the present disclosure, a refresh unit that includes the degraded first cell storing a user data can be identified by the second cell. As such, a refresh rate of a refresh unit can be increased to prevent the user data from being lost. Moreover, since such refresh unit can be identified, there is no need to increase a refresh rate of all refresh units of the memory array. As a result, power consumption is relatively efficient. Moreover, since an increase level of a refresh rate can be adjusted based on a level of degradation of the second cell, application of the DRAM is relatively flexible.

Figure 7:
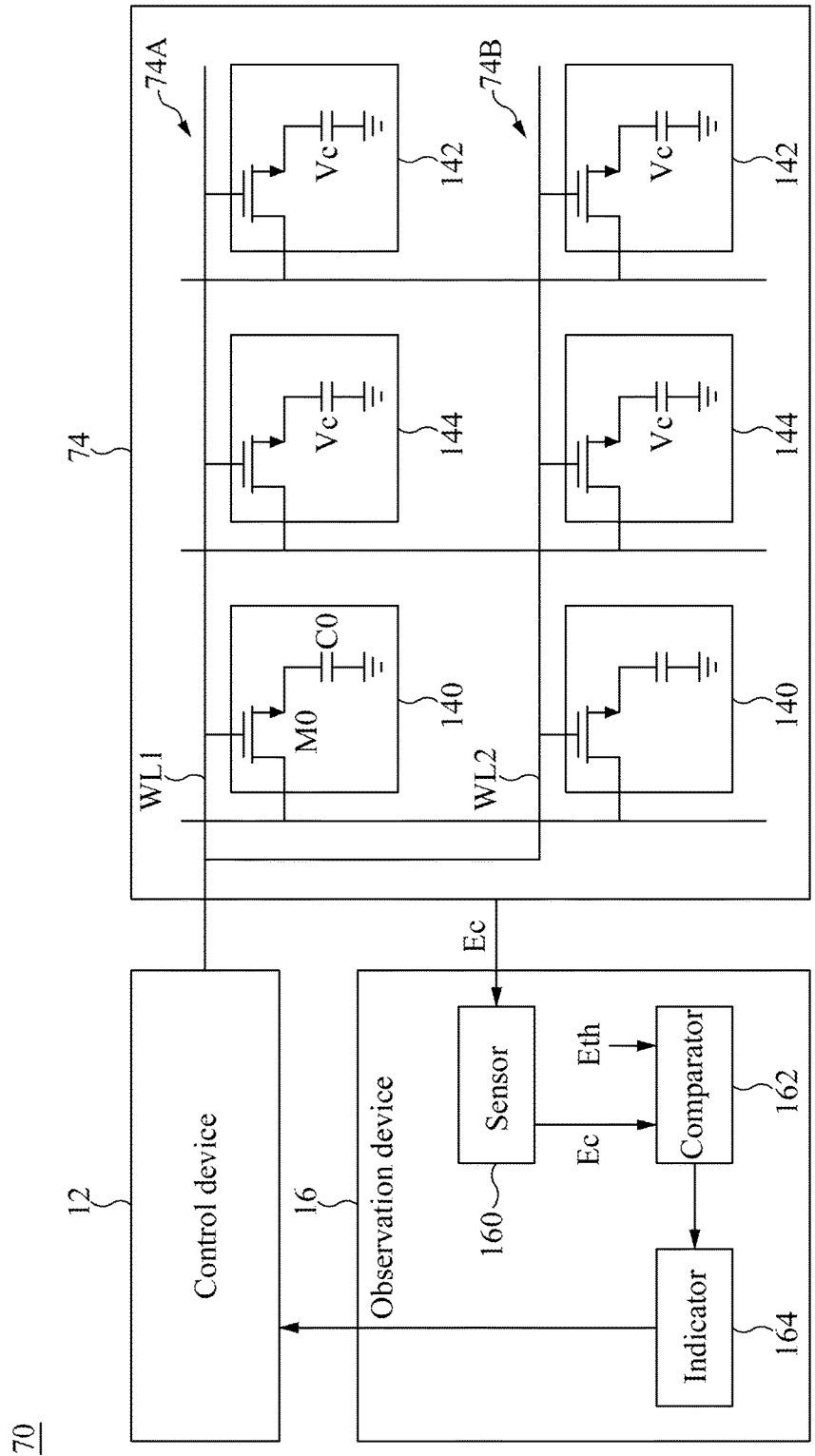
FIG. 7 is a block diagram of another dynamic random access memory (DRAM), in accordance with some embodiments of the present disclosure.

FIG. 7 is a block diagram of another dynamic random access memory (DRAM) 70, in accordance with some embodiments of the present disclosure. Referring to FIG. 7, the DRAM 70 is similar to the DRAM 10 described and illustrated with reference to FIG. 1 except that, for example, the DRAM 70 includes a memory array 74. The memory array 74 includes a first refresh unit 74A and a second refresh unit 74B, which are similar to the first refresh unit 14A and the second refresh unit 14B described and illustrated with reference to FIG. 1 except that each of the first refresh unit 74A and the second refresh unit 74B further includes a third cell 144. The third cell 14 is provided with an electrical energy Ec associated with a voltage level Vc by being programmed with the first cell 140 and the second cell 142.

Function and operation of the third cell 144 are similar to those of the second cell 142. Therefore, the detailed descriptions are omitted herein.

The control device 12 increases the refresh rate to a first refresh rate when an electrical energy Ec of the second cell 142 becomes lower than the threshold electrical energy Eth and when an electrical energy Ec of the third cell 144 remains higher than the threshold electrical energy Eth. Alternatively, the control device 12 increases the refresh rate from the first refresh rate to the second refresh rate when both the electrical energy Ec of the second cell 142 and the electrical energy Ec of the third cell 144 becomes lower than the threshold electrical energy Eth.

In summary, a quantity of cells, whose electrical energy becomes lower than the threshold electrical energy, of the refresh unit has positive correlation with the refresh rate. When the quantity is more, a level of degradation of the refresh unit is higher; accordingly, when the quantity is more, the refresh rate is higher.

In the present disclosure, with the observation device 16 and the second cell 12, a refresh unit that includes the degraded first cell 14 for storing a user data can be identified. As such, a refresh rate of such refresh unit can be increased to prevent the user data from being lost. Moreover, since such refresh unit can be identified, there is no need to increase a refresh rate of all refresh units of the memory array 14. As a result, power consumption is relatively efficient. Moreover, since an increase level of a refresh rate can be adjusted based on a level of degradation of a refresh unit, application of the DRAM 70 is relatively flexible.

Figure 8:
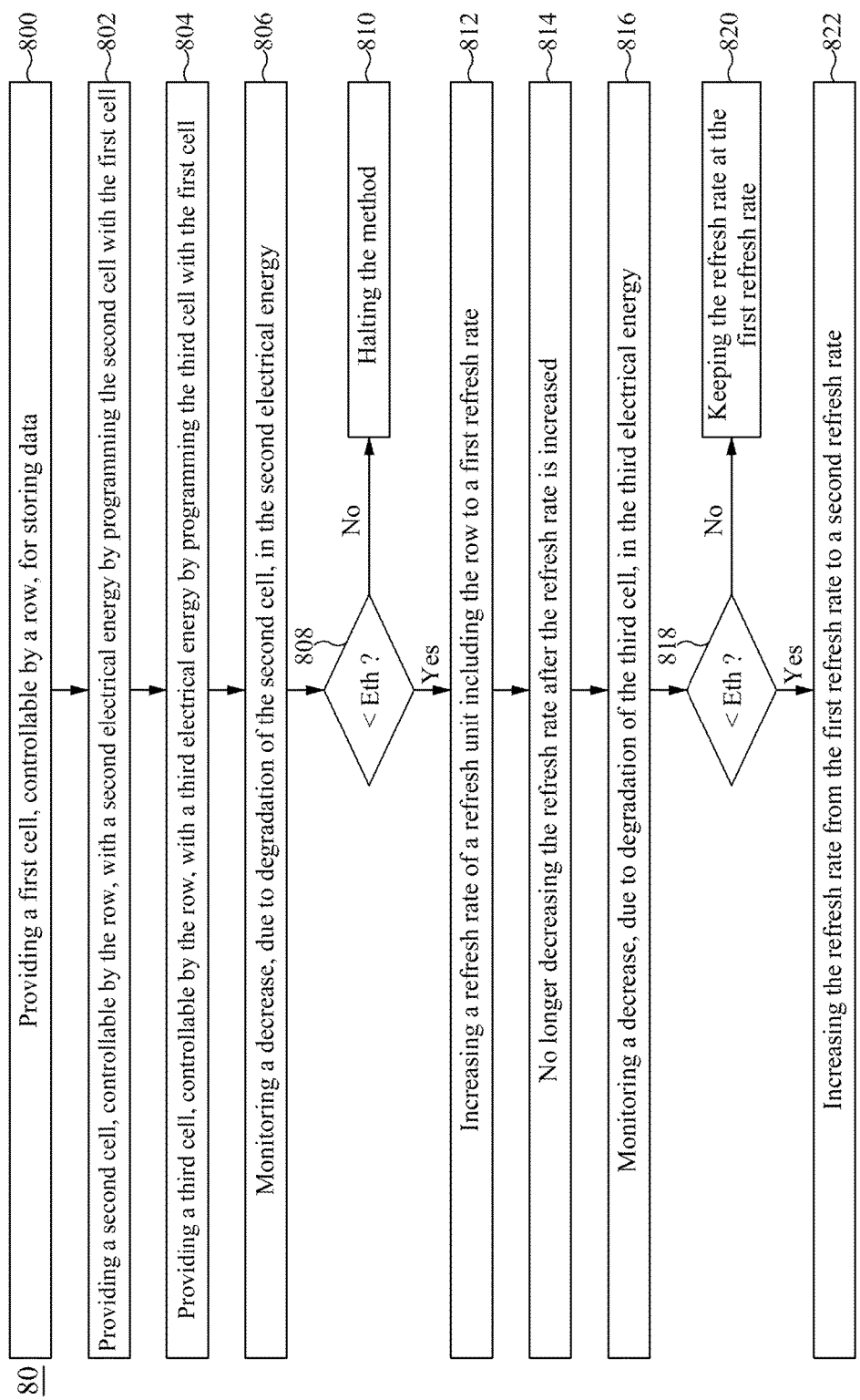
FIG. 8 is a flow diagram of a method of operating a DRAM, in accordance with some embodiments of the present disclosure.

FIG. 8 is a flow diagram of a method 80 operating a DRAM, in accordance with some embodiments of the present disclosure. Referring to FIG. 8, the method 80 includes operations 800, 802, 804, 806, 808, 810, 812, 814, 816, 818, 820 and 822.

The method 80 begins with operation 800, in which a first cell, controllable by a row, for storing data is provided.

The method 80 proceeds to operation 802, in which a second cell, controllable by the row, is provided with a second electrical energy by being programmed with the first cell.

The method 80 proceeds to operation 804, in which a third cell, controllable by the row, is provided with a third electrical energy by being programmed with the first cell and the second cell. In an embodiment, the second electrical energy is the same as the third electrical energy. In another embodiment, the third electrical energy is different from the second electrical energy.

The method 80 proceeds to operation 806, in which a decrease, due to degradation of the second cell, in the second electrical energy is monitored.

The method 80 proceeds to operation 808, in which it is determined whether the second electrical energy becomes lower than a threshold electrical energy Eth, wherein the threshold electrical energy Eth is higher than a standard electrical energy for determining binary logic. The binary logic includes binary 1 and binary 0. If negative, the method 80 proceeds to operation 810, in which the method 80 is halted. If affirmative, the method 80 proceeds to operation 812, in which a refresh rate of a refresh unit that includes the row is increased to a first refresh rate.

The method 80 proceeds to operation 814, in which the refresh rate is no longer decreased after the refresh rate is increased.

The method 80 proceeds to operation 816, in which a decrease, due to degradation of the third cell, in the third electrical energy is monitored.

The method 80 proceeds to operation 818, in which it is determined whether the third electrical energy becomes lower than the threshold electrical energy Eth. If negative, the method 80 proceeds to operation 820, in which the refresh rate is kept at the first refresh rate. If affirmative, the method 80 proceeds to operation 822, in which the refresh rate is increased from the first refresh rate to a second refresh rate.

In the present disclosure, a refresh unit that includes the degraded first cell, which stores a user data, can be identified by the second cell and the third cell. As such, a refresh rate of a refresh unit can be increased to prevent the user data from being lost. Moreover, since such refresh unit can be identified, there is no need to increase a refresh rate of all refresh units of the memory array. As a result, power consumption is relatively efficient. Moreover, since an increase level of a refresh rate can be adjusted based on a level of degradation of the second cell and the third cell, application of the DRAM is relatively flexible.

Figure 9:
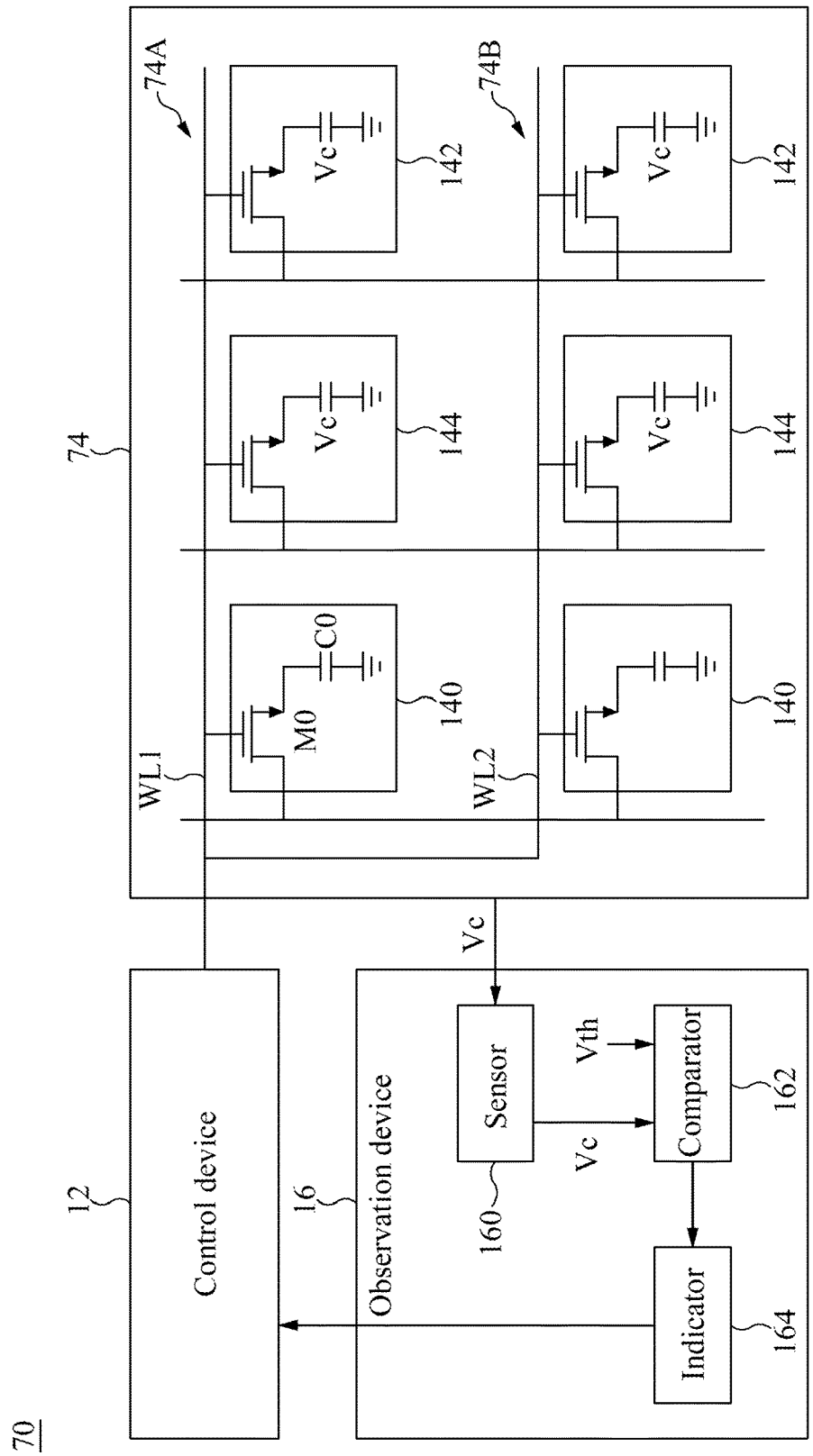
FIG. 9 is a block diagram illustrating an operation of the DRAM shown in FIG. 7, in accordance with some embodiments of the present disclosure.

FIG. 9 is a block diagram illustrating an operation of the DRAM 70 shown in FIG. 7, in accordance with some embodiments of the present disclosure. Referring to FIG. 9, the operation shown in FIG. 9 is similar to that shown in FIG. 7 except that, for example, in FIG. 9, voltage levels Vc of the second cell 142 and the third cell 144 are sensed.

Function and operation of the third cell 144 are similar to those of the second cell 142. Therefore, the detailed descriptions are omitted herein.

The control device 12 increases the refresh rate to a first refresh rate when the voltage level Vc of the second cell 142 becomes lower than a threshold voltage level Vth and when the voltage level Vc of the third cell 144 remains higher than the threshold voltage level Vth. Alternatively, the control device 12 increases the refresh rate from the first refresh rate to a second refresh rate when both the voltage level Vc of the second cell 142 and the voltage level Vc of the third cell 144 becomes lower than the threshold voltage level Vth.

In summary, a quantity of cells, whose voltage level becomes lower than the threshold voltage level, of the refresh unit has positive correlation with the refresh rate. When the quantity is more, a level of degradation of the refresh unit is higher; accordingly, when the quantity is more, the refresh rate is higher.

In the present disclosure, with the observation device 16 and the second cell 12, a refresh unit that includes the degraded first cell 14 for storing a user data can be identified. As such, a refresh rate of such refresh unit can be increased to prevent the user data from being lost. Moreover, since such refresh unit can be identified, there is no need to increase a refresh rate of all refresh units of the memory array 14. As a result, power consumption is relatively efficient. Moreover, since an increase level of a refresh rate can be adjusted based on a level of degradation of a refresh unit, application of the DRAM 70 is relatively flexible.

Figure 10:
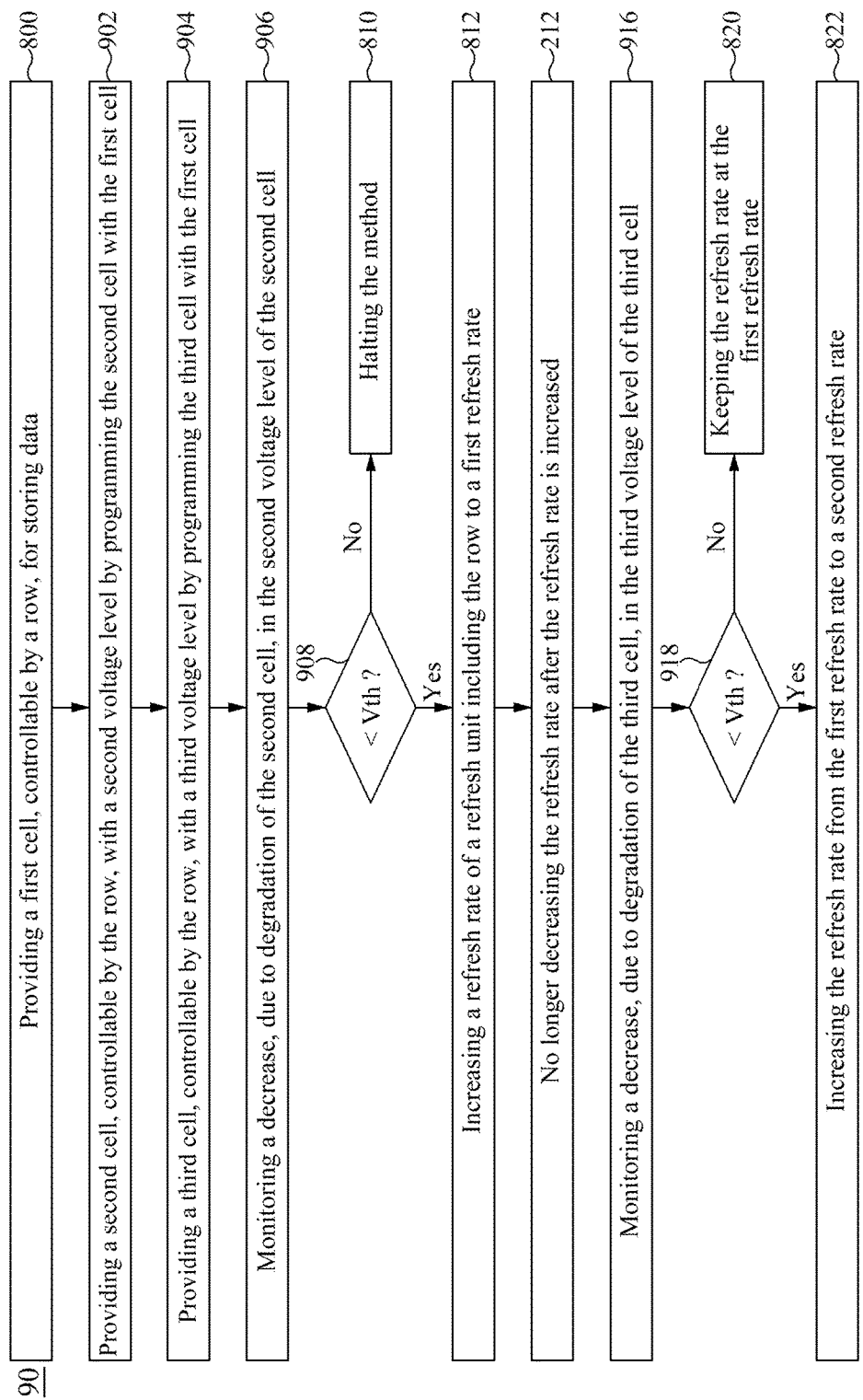
FIG. 10 is a flow diagram of another method of operating a DRAM, in accordance with some embodiments of the present disclosure.

FIG. 10 is a flow diagram of another method 90 of operating a DRAM, in accordance with some embodiments of the present disclosure. Referring to FIG. 10, the method 90 is similar to the method 80 described and illustrated with reference to FIG. 8 except that, for example, the method 90 includes operations 902, 904, 906, 908, 916 and 918.

In operation 902, a second cell, controllable by the row, is provided with a second voltage level by being programmed with the first cell.

In operation 904, a third cell, controllable by the row, is provided with a third voltage level by being programmed with the first cell and the second cell.

In operation 906, a decrease, due to degradation of the second cell, in the second voltage level of the second cell is monitored.

In operation 908, it is determined whether the second voltage level becomes lower than a threshold voltage Vth, which is higher than a standard voltage level for determining binary logic. If negative, the method 90 proceeds to operation 810. If affirmative, the method 90 proceeds to operation 812.

In operation 916, a decrease, due to degradation of the third cell, in the third voltage level of the third cell is monitored.

In operation 918, it is determined whether the third voltage level becomes lower than the threshold voltage level Vth, which is higher than the standard voltage level. If negative, the method 90 proceeds to operation 820. If affirmative, the method 90 proceeds to operation 822.

Although in the flow diagram, the refresh rate is increased in two stages, increasing to the first refresh rate and then increasing from the first refresh rate to the second refresh rate, the present disclosure is not limited thereto. The refresh rate can be increased directly to the second refresh rate.

In the present disclosure, a refresh unit that includes the degraded first cell storing a user data can be identified by the second cell. As such, a refresh rate of a refresh unit can be increased to prevent the user data from being lost. Moreover, since such refresh unit can be identified, there is no need to increase a refresh rate of all refresh units of the memory array. As a result, power consumption is relatively efficient. Moreover, since an increase level of a refresh rate can be adjusted based on levels of degradation of the second cell and the third cell, application of the DRAM is relatively flexible.

Figure 11:
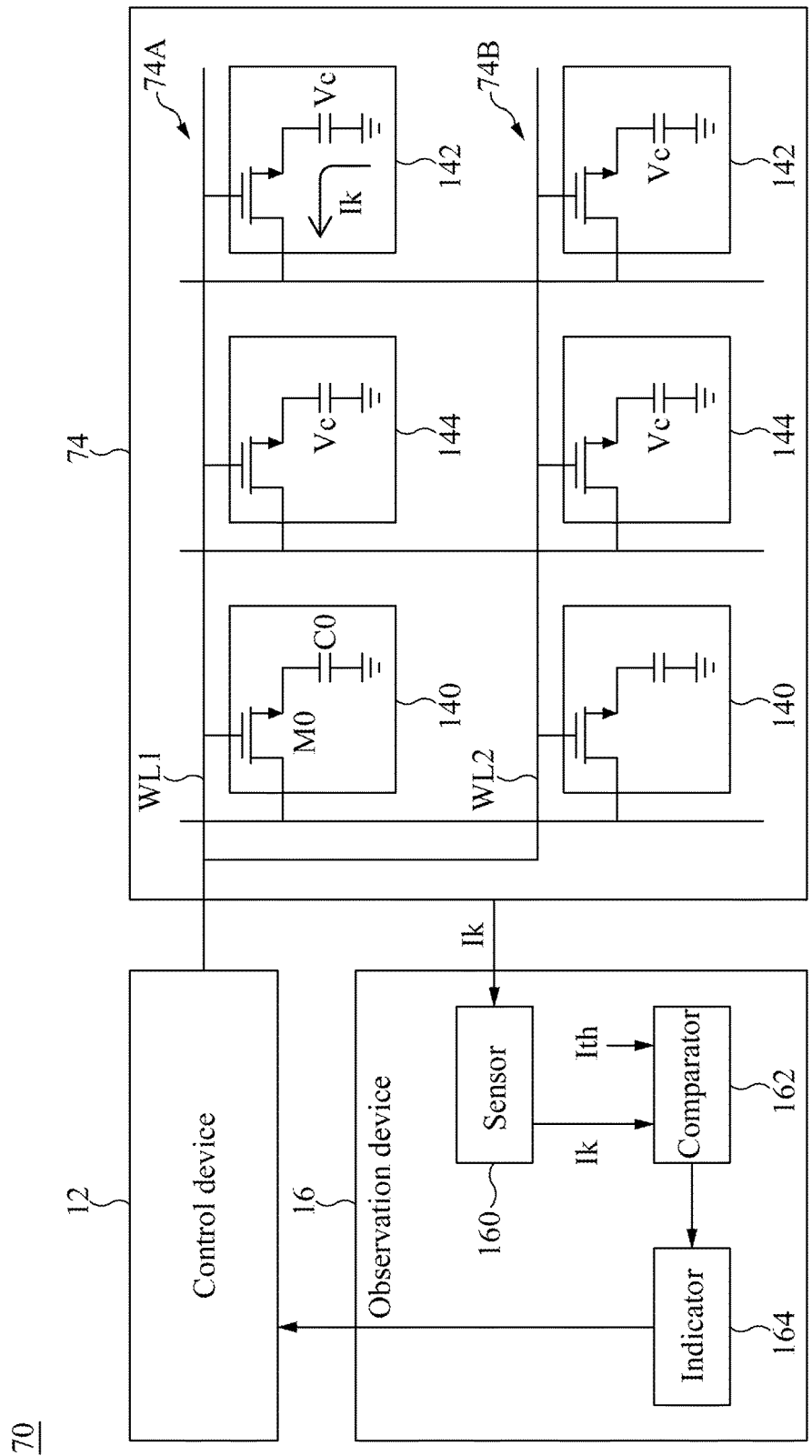
FIG. 11 is a block diagram illustrating another operation of the DRAM shown in FIG. 7, in accordance with some embodiments of the present disclosure.

FIG. 11 is a block diagram illustrating another operation of the DRAM 70 shown in FIG. 7, in accordance with some embodiments of the present disclosure. Referring to FIG. 11, the operation shown in FIG. 11 is similar to that shown in FIG. 9 except that, for example, in FIG. 11, magnitude Ik of each of leakage currents from the second cell 142 and the third cell 144 is sensed.

Function and operation of the third cell 144 are similar to those of the second cell 142. Therefore, the detailed descriptions are omitted herein.

The control device 12 increases the refresh rate to a first refresh rate when the magnitude Ik of a leakage current from the second cell 142 becomes higher than a threshold magnitude Ith and when the magnitude Ik of a leakage current from the third cell 144 remains lower than the threshold magnitude Ith. Alternatively, the control device 12 increases the refresh rate from the first refresh rate to a second refresh rate when both the magnitudes Ik associated with the second cell 142 and the third cell 144 become higher than the threshold magnitude Ith.

In summary, a quantity of cells, whose magnitude of a leakage current becomes lower than the threshold magnitude, of the refresh unit has positive correlation with the refresh rate. When the quantity is more, a level of degradation of the refresh unit is higher; accordingly, when the quantity is more, the refresh rate is higher.

In the present disclosure, with the observation device 16 and the second cell 12, a refresh unit that includes the degraded first cell 14 for storing a user data can be identified. As such, a refresh rate of such refresh unit can be increased to prevent the user data from being lost. Moreover, since such refresh unit can be identified, there is no need to increase a refresh rate of all refresh units of the memory array 14. As a result, power consumption is relatively efficient. Moreover, since an increase level of a refresh rate can be adjusted based on a level of degradation of a refresh unit, application of the DRAM 70 is relatively flexible.

Figure 12:
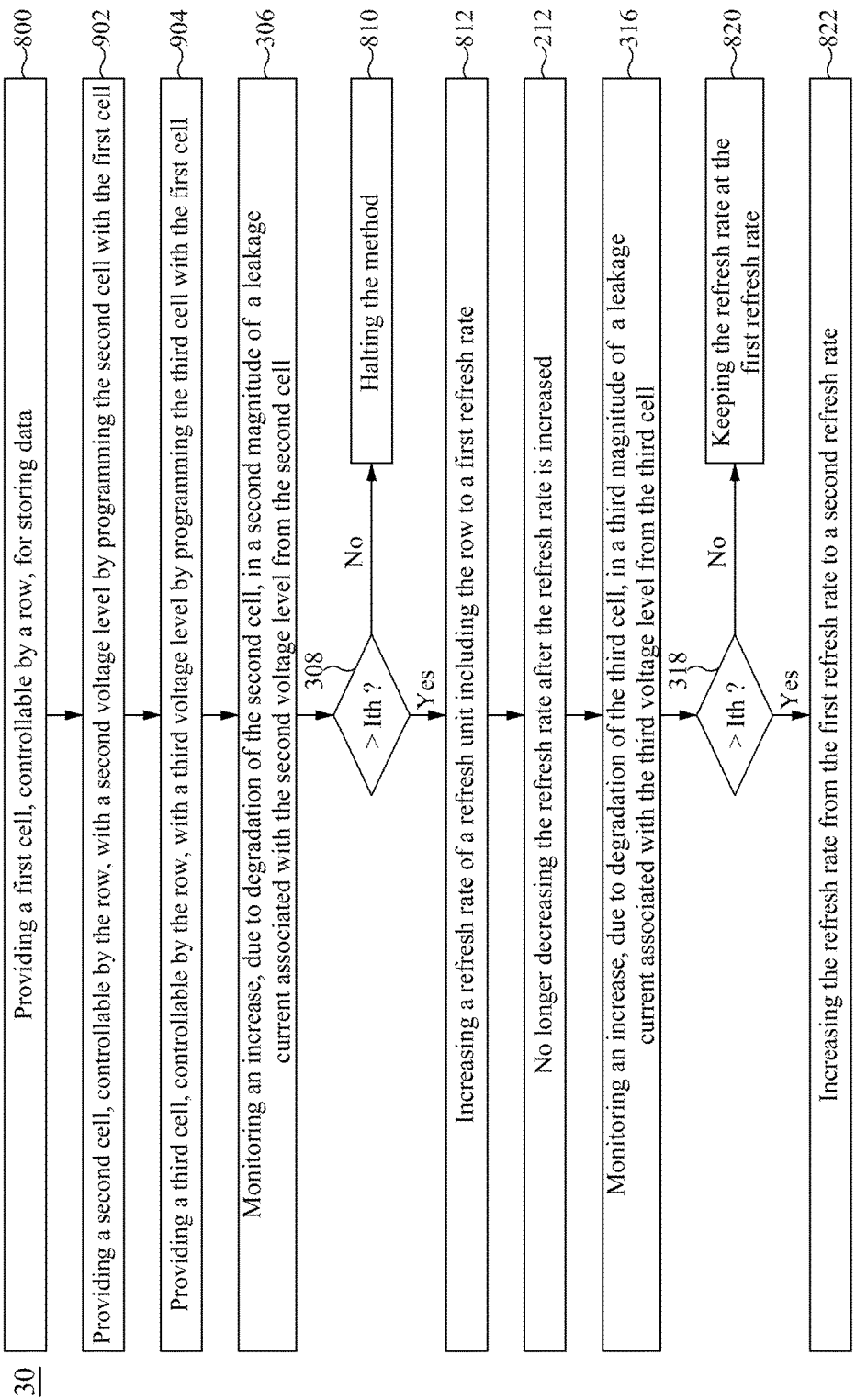
FIG. 12 is a flow diagram of yet another method of operating a DRAM, in accordance with some embodiments of the present disclosure.

FIG. 12 is a flow diagram of yet another method 30 of operating a DRAM, in accordance with some embodiments of the present disclosure. Referring to FIG. 12, the method 30 is similar to the method 90 described and illustrated with reference to FIG. 10 except that, for example, the method 30 includes operations 306, 308, 316 and 318.

In operation 306, an increase, due to degradation of the second cell, in a second magnitude of a leakage current, associated with the second voltage level, from the second cell is monitored.

In operation 308, it is determined whether the second magnitude becomes higher than a threshold magnitude Ith. If negative, the method 30 proceeds to operation 810. If affirmative, the method 30 proceeds to operation 812.

In operation 316, an increase, due to degradation of the third cell, in a third magnitude of a leakage current associated with the third voltage level from the third cell is monitored.

In operation 318, it is determined whether the third magnitude becomes higher than the threshold magnitude Ith. If negative, the method 30 proceeds to operation 820. If affirmative, the method 30 proceeds to operation 822.

Although in the flow diagram, the refresh rate is increased in two stages, increasing to the first refresh rate and then increasing from the first refresh rate to the second refresh rate, the present disclosure is not limited thereto. The refresh rate can be increased directly to the second refresh rate.

In the present disclosure, a refresh unit that includes the degraded first cell, which stores a user data, can be identified by the second cell. As such, a refresh rate of a refresh unit can be increased to prevent the user data from being lost. Moreover, since such refresh unit can be identified, there is no need to increase a refresh rate of all refresh units of the memory array. As a result, power consumption is relatively efficient. Moreover, since an increase level of a refresh rate can be adjusted based on levels of degradation of the second cell and the third cell, application of the DRAM is relatively flexible.

One aspect of the present disclosure provides a DRAM including a memory array and a control device. The memory array includes a refresh unit. The refresh unit includes a first cell and a second cell. The first cell is configured to store data. The second cell is configured to store an electrical energy by being programmed with the first cell, wherein the first cell and the second cell are controllable by a same row of the memory array. The control device is configured to increase a refresh rate of the refresh unit to a first refresh rate when the electrical energy of the second cell becomes lower than a threshold electrical energy, wherein the threshold electrical energy is higher than a standard electrical energy for determining binary logic.

Another aspect of the present disclosure provides a method. The method includes providing a first cell, controllable by a row, for storing data; providing a second cell, controllable by the row, with an electrical energy by programming the second cell with the first cell; and increasing a refresh rate of a refresh unit that includes the row to a first refresh rate when the stored electrical energy of the second cell becomes lower than a threshold electrical energy, wherein the threshold electrical energy is higher than a standard electrical energy for determining binary logic.

Although the present disclosure and its advantages have been s1 described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A dynamic random access memory (DRAM), comprising:
   a memory array including:
      a refresh unit including:
         a first cell configured to store data; and
         a second cell configured to have a stored electrical energy by being programmed with the first cell, wherein the first cell and the second cell are controllable by a same row of the memory array; and
      a control device configured to increase a refresh rate of the refresh unit to a first refresh rate when the stored electrical energy of the second cell becomes lower than a threshold electrical energy, wherein the threshold electrical energy is higher than a standard electrical energy for determining binary logic.

2. The DRAM of claim 1, wherein the control device is configured to no longer decrease the refresh rate after the refresh rate is increased.

3. The DRAM of claim 1, wherein a quantity of cells, whose stored electrical energy becomes lower than the threshold electrical energy, of the refresh unit has positive correlation with the refresh rate.

4. The DRAM of claim 1, wherein the stored electrical energy is decreased by a decreased level, wherein the decreased level has positive correlation with the refresh rate.

5. The DRAM of claim 1, further comprising:
   an observation device configured to monitor a decrease, due to a degradation of the second cell, in the stored electrical energy of the second cell.

6. The DRAM of claim 1, wherein the control device is configured to increase the refresh rate to the first refresh rate when a voltage level of the second cell becomes lower than a threshold voltage level, wherein the threshold voltage level is higher than a standard voltage level for determining binary logic.

7. The DRAM of claim 6, wherein the threshold voltage level is a first threshold voltage level, wherein the control device is configured to increase the refresh rate from the first refresh rate to a second refresh rate when the voltage level becomes lower than both the first threshold voltage level and a second threshold voltage level, wherein the second threshold voltage is lower than the first threshold voltage level and higher than the standard voltage level.

8. The DRAM of claim 1, wherein the control device is configured to increase the refresh rate to the first refresh rate when a magnitude of a leakage current from the second cell becomes higher than a threshold magnitude.

9. The DRAM of claim 8, wherein the threshold magnitude is a first threshold magnitude, wherein the control device is configured to increase the refresh rate from the first refresh rate to a second refresh rate when the magnitude becomes higher than both the first threshold magnitude and a second threshold magnitude higher than the first threshold magnitude.

10. The DRAM of claim 1, wherein the refresh unit further includes a third cell,
    wherein the control device is configured to increase the refresh rate to the first refresh rate when the stored electrical energy becomes lower than the threshold electrical energy and when a stored electrical energy of the third cell is higher than the threshold electrical energy.

11. The DRAM of claim 10, wherein the control device is configured to increase the refresh rate from the first refresh rate to the second refresh rate when both the stored electrical energy of the second cell and the stored electrical energy of the third cell become lower than the threshold electrical energy.

12. The DRAM of claim 10, wherein the control device is configured to increase the refresh rate to the first refresh rate when a voltage level of the second cell becomes lower than a threshold voltage level and when a voltage level of the third cell is higher than the threshold voltage level, wherein the threshold voltage level is higher than a standard voltage level for determining binary logic.

13. The DRAM of claim 12, wherein the control device is configured to increase the refresh rate from the first refresh rate to the second refresh rate when both the voltage level of the second cell and the voltage level of the third cell become lower than the threshold voltage level.

14. The DRAM of claim 10, wherein the control device is configured to increase the refresh rate to the first refresh rate when a magnitude of a leakage current from the second cell becomes higher than a threshold magnitude and when a magnitude of a leakage current from the third cell is lower than the threshold magnitude.

15. The DRAM of claim 14, wherein the control device is configured to increase the refresh rate from the first refresh rate to the second refresh rate when the magnitude of each of the leakage currents from the second cell and the third cell is higher than the threshold magnitude.

16. A method, comprising:
providing a first cell, controllable by a row, for storing data;
providing a second cell, controllable by the row, with a stored electrical energy by programming the second cell with the first cell; and
increasing a refresh rate of a refresh unit that includes the row to a first refresh rate when the stored electrical energy of the second cell becomes lower than a threshold electrical energy, wherein the threshold electrical energy is higher than a standard electrical energy for determining binary logic.

17. The method of claim 16, further comprising:
monitoring a decrease, due to degradation of the second cell, in the stored electrical energy.

18. The method of claim 16, further comprising:
no longer decreasing the refresh rate after the refresh rate is increased.

19. The method of claim 16,
wherein the providing the second cell, controllable by the row, with the stored electrical energy by programming the second cell with the first cell includes:
providing the second cell with a voltage level, and
wherein the increasing the refresh rate of the refresh unit that includes the row to the first refresh rate when the stored electrical energy of the second cell becomes lower than the threshold electrical energy includes:
increasing the refresh rate to the first refresh rate when the level of the second cell becomes lower than a threshold voltage level, wherein the threshold voltage level is higher than a standard voltage level for determining binary logic.

20. The method of claim 16, wherein the increasing the refresh rate of the refresh unit that includes the row to the first refresh rate when the stored electrical energy of the second cell becomes lower than the threshold electrical energy includes:
increasing the refresh rate to the first refresh rate when a magnitude of a leakage current from the second cell becomes higher than a threshold magnitude.

* * * * *